(12) United States Patent
Broutin et al.

(10) Patent No.: US 6,524,402 B1
(45) Date of Patent: Feb. 25, 2003

(54) PASSIVATION METHOD FOR METALLIC ARTICLES OF NICKEL AND IRON-BASED SUPERALLOY

(75) Inventors: Paul Broutin, Chapanost (FR); Pascal Nisio, Lyons (FR); François Ropital, Paris (FR)

(73) Assignee: Institut Francais du Petrole, Rueil Malmaison (FR)

( * ) Notice: Subject to any disclaimer, the term of this patent is extended or adjusted under 35 U.S.C. 154(b) by 0 days.

(21) Appl. No.: 08/494,220

(22) Filed: Jun. 23, 1995

(30) Foreign Application Priority Data

Jun. 24, 1994 (FR) .............................. 94 07907

(51) Int. Cl.⁷ ................................ C23C 8/00
(52) U.S. Cl. .................. 148/240; 148/277; 427/237; 427/249.17; 427/249.19; 427/255.15; 427/255.18; 428/450; 428/472
(58) Field of Search ................ 427/249, 237, 427/249.17, 249.19, 255.15, 255.18; 428/450, 472; 148/240, 277

(56) References Cited

U.S. PATENT DOCUMENTS

| | | | | |
|---|---|---|---|---|
| 5,141,613 A | * | 8/1992 | Adoncecchi | 427/249 |
| 5,208,069 A | * | 5/1993 | Clark | 427/226 |
| 5,242,574 A | * | 9/1993 | Broutin | 427/249 |
| 5,424,095 A | * | 6/1995 | Clark | 427/237 |

FOREIGN PATENT DOCUMENTS

| | | |
|---|---|---|
| EP | 0 446 988 | 9/1991 |
| EP | 0 540 084 | 5/1993 |
| FR | 2 662 704 | 12/1991 |

OTHER PUBLICATIONS

Patent Abstracts of Japan, vol. 14, No. 299 (C–733), Jun. 27, 1990.
Patent Abstracts of Japan, vol. 14, No. 115 (C–696), Mar. 5, 1990.
Patent Abstracts of Japan, vol. 10, No. 23 (C–325), Jan. 29, 1986.
Patent Abstracts of Japan, vol. 16, No. 265 (C–951), Jun. 16, 1992.

* cited by examiner

*Primary Examiner*—John Sheehan
*Assistant Examiner*—Andrew L. Oltmans
(74) *Attorney, Agent, or Firm*—Millen, White, Zelano & Branigan, P.C.

(57) ABSTRACT

A passivation method for the metallic surface of a nickel and iron-based superalloy which is used as the constituent material of reactor or furnace walls is described, in which the superalloy is coated on at least one of its surfaces which comes into contact with a corrosive atmosphere containing either hydrocarbons at high temperature or containing oxidizing gases at high temperature, with at least two successive layers resulting from successive chemical vapour deposition of its one or more constituent elements, the external phase, resulting from chemical vapour deposition of at least one silicon compound and the layer(s) deposited between the superalloy surface, and the external layer resulting from chemical vapour deposition of at least one of a metal or metalloid.

25 Claims, No Drawings

PASSIVATION METHOD FOR METALLIC ARTICLES OF NICKEL AND IRON-BASED SUPERALLOY

BACKGROUND OF THE INVENTION

The present invention concerns a passivation method for metallic articles of nickel and iron-based superalloy. Passivation concerns the surface of these metallic articles. The invention also concerns the metallic product in which at least a portion of its surface has been treated using the passivation method of the present application. The method of the present invention produces metallic articles which have a better resistance to oxidizing atmospheres at high temperature, and greatly reduced carburation and coking in hydrocarbons, compared with untreated articles.

In particular, the present method can limit corrosion of the external surfaces of the articles by oxidation during contact of these surfaces with an oxidizing atmosphere and can also limit cementation and coking when in contact with hydrocarbons at high temperature. This method is particularly applicable to the treatment of reactor or furnace surfaces, in particular to pipe stills used in the industry. Within the context of the present description, the terms carburation and carburizing are deemed to be equivalent.

More particularly, this method can limit coking in thermal hydrocarbon cracking reactors and in pipe stills which heat hydrocarbons to high temperature, for example to a temperature of more than 350° C. The skilled person is well aware that coking reactions at the reactor and/or furnace tube walls appear above this temperature. The method of the present invention is more particularly applicable to apparatus for carrying out steam cracking processes or pyrolysis processes in the absence of a diluent or in the presence of a diluent other than steam, for example in the presence of hydrogen, hydrocarbons or hydrocarbon cuts.

The method of the present invention is also applicable to apparatus for carrying out catalytic dehydrogenation or steam reforming processes, and hydrocarbon or hydrocarbon cut visbreaking processes.

Many documents describe the coke formation reaction in a variety of reactions which bring hydrocarbons into contact with the walls at high temperature. The coking phenomenon is particularly well described and studied within the framework of thermal hydrocarbon cracking. The leading article is considered to be that of Professor Froment, published in 1990 in the periodical "Review of Chemical Engineering", volume 6, number 4, pages 292 to 328, entitled "Coke formation in the thermal cracking of hydrocarbons". A more recent article appeared in the Review of the Institut Frangais du Petrole of 1992, by Billaud, Broutin, Busson, Gueret and Weill, volume 47, number 4, pages 537 to 549, entitled "Coke formation during hydrocarbon pyrolysis". The first section appeared in that review and the second section appeared in the same review in 1993, volume 48, number 2, pages 115 to 125, with the same title.

Summarising the observations described in the prior art, coke formation during thermal hydrocarbon cracking is a complex phenomenon which brings several mechanisms into play, at least one of which involving reactions which are catalysed by the presence of oxides of metallic elements such as nickel, iron or cobalt at the walls of the apparatus used to carry out these processes. These metallic elements are in general contained in large quantities in the refractory superalloys employed, primarily because of the thermal conditions encountered at the walls of these apparatus. The catalytic mechanism is very dominant: observations have shown that if this mechanism is inhibited, then in the case of steam cracking the period between successive shut-downs to decoke the furnaces is increased by a factor of at least about 3.

A few documents have described methods for inhibiting the catalytic formation of coke: a particular example is U.S. Pat. No. 5,208,069, which describes a passivation method for the metallic surface of reactor tubes which come into contact with hydrocarbons by in-situ decomposition (i.e., in the assembled apparatus) of an organometallic non oxygenated silicone derivative under conditions which form a fine layer of ceramic material on the surface of these tubes. This method, in which deposition is effected at atmospheric pressure or at a slight underpressure, generally does not produce relatively uniform deposition over the entire length of the tubes since the rate of growth of the deposit is not uniform and thus the thickness, and also the quality of the deposit, varies along the tube. These variations entrain a risk of producing zones with thick deposits and hence low adherence and/or zones where the silicon carbide deposit is of poor quality and thus also of low adherence. The pressure at which the vapour phase deposition is carried out (according to the examples in that patent) to deposit the organometallic silicon compound is much higher and a homogeneous deposit cannot be produced since the gas diffusion distances are much smaller than in a vacuum, for example at a pressure of less than $10^{+4}$ Pascals. Further, the deposited silicon carbide is a compound with a low expansion coefficient, while the superalloy usually possesses a much higher expansion coefficient, which means that with time and with the cycles of heating and cooling, there is a substantial risk that, at least at some points, the integrity of the silicon carbide coating will fail and, as a consequence, contact will occur between the hydrocarbons and the superalloy, which will increase the coking rate of the apparatus.

U.S. Pat. No. 5,242,574 also describes a passivation method for the walls of a reactor formed from a nickel and iron-based superalloy and containing a high aluminium content (4% to 6% by weight). This passivation method consists of forming a metal oxide layer by preoxidation of the alloy surface, which involves the formation of oxides of the metals forming the alloy. Passivation in this case is explained by the beneficial effect of the aluminium in the matrix, as it makes possible the generation of a stable superficial alumina layer by simple selective partial oxidation (at the oxygen partial pressure and temperature conditions described in that patent). This method does not generally produce a uniform layer either from the aspect of composition or from other physical characteristics. Further, this passivation method is only readily applicable in the case of a superalloy with a high aluminium content.

In addition, when using alloys with high aluminium contents, very frequently an intermetallic phase with composition $Ni_3Al$ is formed. This intermetallic phase is formed during use at high temperature and renders the material brittle: the material ages and the creep strength reduces with time. This phenomenon means that the maximum temperature at which this type of material can be used must be 100° C. lower than those of superalloys based on nickel and iron which only contain small to very small quantities of aluminium, for example less than 0.5% by weight.

Further, the presence of aluminium in the matrix can lead to precipitation of the intermetallic phase on the grain boundaries during welding. This adversely affects mechanical behaviour (appearance of cracks and even breaks).

Welding this type of material is difficult, as with all nickel-based superalloys with an aluminium content of more than about 3%. These materials are classified as difficult to weld (see E Bradley, "Welding of superalloys", Superalloys—a technical guide, 1988, Chapter 13, pages 197 to 220).

The presence of aluminium in the matrix means that the coatings adhere to the material with difficulty. Coatings obtained by chemical vapour deposition (CVD) (for example those described in U.S. Pat. No. 5,242,574) on this type of material are less adhesive and weaker, in particular during thermal cycling.

The present invention provides a passivation method for the metallic surface of a superalloy containing little or no aluminium which at least partially overcomes the drawbacks of the prior art methods and produces a coating which is highly resistant to thermal cycling and has good adhesion and homogeneity. The quality of the coating produced using the method of the invention can be appreciated, as will be shown in the examples illustrating the present application, by oxidation and/or coking tests for metallic surfaces which have undergone prior art passivation treatments and metallic surfaces which have undergone passivation treatments in accordance with the invention.

SUMMARY OF THE INVENTION

More generally, the invention concerns a passivation method for the metallic surface of a nickel and iron-based superalloy containing less than 3% by weight of aluminium, preferably less than 1% by weight of aluminium and more preferably less than 0.5% by weight of aluminium, said surface being a surface which comes into contact with an atmosphere containing hydrocarbons at high temperature, or into contact with an atmosphere containing oxidizing gases at high temperature, i.e., at a temperature which is normally more than 200° C., and usually more than 500° C. In particular, this method can be employed when using superalloys as defined above to construct furnaces or thermal hydrocarbon cracking or catalytic hydrocarbon cracking reactors. The method of the present invention is characterised in that the superalloy used as the constituent material of the reactor or furnace walls, for example pipe stills, is coated on at least one of its faces, normally on both faces, which comes into contact with a corrosive atmosphere containing either hydrocarbons at high temperature, or containing oxidizing gases at high temperature, by at least two successive layers resulting from the successive chemical vapour deposition of the constituent element(s) thereof, the external phase, i.e., that which comes into direct contact with the corrosive atmosphere, resulting from the chemical vapour deposition of at least one silicon compound and the layer(s) deposited between the superalloy surface and the external layer resulting from the chemical vapour deposition of at least one compound of a metal or metalloid of the periodic classification of the elements, preferably of a metal from group 4 of this classification such as titanium or zirconium, preferably titanium, the layer(s) being selected such that the expansion coefficients of these layers decrease in value from that of the superalloy to that of the external layer. The intermediate layer(s) have at least a double function: they improve the adhesion and the thermal shock resistance of the coating produced. The layer(s) also limit interdiffusion between the superalloy and the external layer.

Normally, the superalloy has an expansion coefficient of about $10 \times 10^{-6}$ to about $25 \times 10^{-6}$ per degree Kelvin ($K^{-1}$) and the external layer formed from a silicon compound has an expansion coefficient which is lower than that of the superalloy, at about $2 \times 10^{-6}$ to about $10 \times 10^{-6}$ $K^{-1}$. The intermediate layer(s) normally have an expansion coefficient of between $4 \times 10^{-6}$ and $12 \times 10^{-6}$ $K^{-1}$, always lower than that of the superalloy and always higher than that of the external layer.

In a particular embodiment of the invention, the superalloy is coated with a single intermediate layer between the external layer and the superalloy surface.

The intermediate coating layers obtained by chemical vapour deposition are either stoichiometric or are solid solutions. Normally, these stoichiometric compositions are selected from the group formed by titanium carbide TiC, titanium nitride TiN, and aluminium nitride. Normally, the solid solutions are selected from the group formed by nitrides with general formula $Ti_uAl_vN_w$, where u, v and w are positive numbers, u normally being a number between about 0.4 and about 0.62, and v and w, which may be identical or different, are numbers between about 0 and about 1, and carbo-nitrides of titanium with general formula $Ti_xC_yN_z$ where x, y and z are positive numbers, x normally being a number between about 0.35 and about 0.55 and y and z, which may be identical or different, being numbers between about 0 and about 1.

In a particular embodiment of the present invention, a superalloy containing at least 0.1% by weight of carbon and with the first coating layer obtained by chemical vapour deposition, which is directly in contact with the superalloy, comprises at least one stoichiometric compound or at least one solid solution selected from the group formed by TiC and $Ti_xC_yN_z$, where x, y and z have the meanings given above.

In a particular embodiment of the invention, the external layer which is in contact with the corrosive atmosphere comprises at least one stoichiometric compound or at least one solid solution formed from the Si—Al—O—N—C system. The term "system" is normally used by the skilled person in the chemical vapour deposition art. Within the context of the present invention, the term "system" represents the ensemble of stoichiometric compounds or solid solutions formed from the elements of the system.

In a further embodiment of the invention, the external layer which is in contact with the corrosive atmosphere comprises at least one stoichiometric compound selected from the group formed by silicon carbide with formula SiC and silicon nitride with formula $Si_3N_4$. The external layer may also comprise a mixture of these two compounds.

While the coatings can be produced by conventional chemical vapour deposition techniques which are known to the skilled person, it is often preferable, in order to obtain highly adhesive layers with excellent homogeneity and with good resistance to thermal cycling, to carry out the chemical vapour deposition at a temperature which is greater than or equal to about 800° C., more preferably about 900° C. to about 1100° C. Deposition is normally carried out at a pressure below atmospheric pressure, usually at a pressure of about 100 to about 90000 Pascals, preferably about 1000 to 10000 Pascals. The molar flow rate (in the depositing reactor) of the gaseous mixture used to carry out the chemical vapour deposition is normally about $1 \times 10^{-6}$ mole per square centimetre per second (mole$\times$cm$^{-2}$$\times$s$^{-1}$) to about $1 \times 10^{-2}$ mole$\times$cm$^{-2}$$\times$s$^{-1}$. When coating with titanium carbide, the C/Ti atomic ratio in the gaseous phase is normally about 0:1 to about 150:1, more preferably about 0:1 to about 50:1. In the absence of a carbon-containing compound in the gaseous phase, this is provided by the superalloy.

The method of passivation of the metallic surface of the present invention is particularly well suited to forming a protective coating on the internal surface (and optionally on the internal surface of the external surface) of pipe stills for hydrocarbon steam cracking. The coating(s) can be formed in-situ after assembly of the pipework in a first step before operating the furnace for steam cracking, or ex-situ before assembly of the pipework in a chemical vapour deposition treatment furnace. In the case of ex-situ treatment, the coating can be formed element by element or series of elements by series of elements.

Chemical vapour deposition is a technique which is well known to the skilled person and need not be further described in the present description. By way of example, in the case of forming a silicon based coating, deposition can be carried out using a silane, alkylsilane, aminoalkylsilane, haloalkylsilane, halosilane or silazane. A chloroalkylsilane or a chlorosilane can be used, for example. For a silicon carbide coating, CVD can, for example, be effected by decomposition of a silane or by reduction, for example using hydrogen, of a chloroalkylsilane such as trichloromethylsilane. For a titanium based coating, the same types of compounds can be used, for example titanium halides, in particular titanium tetrachloride. When using one or more titanium halides to deposit titanium carbide, reduction of the halide(s) can be effected using a reducing agent such as hydrogen. CVD is normally carried out in the presence of hydrogen under conditions such that the H/metal atomic ratio in the gaseous phase is about 5:1 to about 300:1, preferably about 10:1 to about 50:1.

Normally, each layer of the coating is about $0.1 \times 10^{-6}$ meters (m) to about $30 \times 10^{-6}$ m thick. Preferably, the intermediate layer(s) are thinner than the external layer. For a coating comprising two layers, for example, the intermediate layer will be about $0.15 \times 10^{-6}$ m to about $5 \times 10^{-6}$ m thick and the external layer will be about $1 \times 10^{-6}$ m to about $30 \times 10^{-6}$ m thick, more preferably about $6 \times 10^{-6}$ m to about $25 \times 10^{-6}$ m thick.

Most preferably, a superalloy comprising 0.2% to 0.6% by weight of carbon, 0.5% to 2% of manganese, 0.5% to 2% of silicon, 30% to 40% of nickel and 20% to 30% of chromium is used, along with other optional metals such as niobium, titanium or zirconium, the complement to 100% being iron. The tests in the following examples which illustrate the invention were carried out on tubes of Manaurite XM, a superalloy comprising 33% to 38% by weight of nickel, 23% to 28% of chromium, 1% to 2% of silicon, 1% to 1.5% of manganese and 0.3% to 0.6% of carbon, the complement to 100% being iron.

The present invention also concerns a product comprising a nickel and iron-based superalloy containing less than 3% by weight of aluminium, preferably less than 1% by weight of aluminium, more preferably less than 0.5% by weight of aluminium, and including a passivation coating obtained using the method described above.

The following example illustrates the invention and its advantages over the prior art, in particular that described in European patent EP-B-0 476 027.

Tube A was formed from Manaurite XM for comparison. Tube B was formed from Manaurite XM coated with titanium carbide alone, also for comparison. Tube C was of Manaurite XM coated with a first layer of titanium carbide and an external layer of silicon carbide in accordance with the invention. Finally, tube D was formed from Manaurite XM coated with silicon carbide, for comparison.

Naphtha steam cracking tests were carried out in the presence of steam at a skin temperature of 1048° C. at the pyrolysis tube outlet in a pilot plant provided with four successive tubes with the same dimensions having different compositions as described above and whose coatings were formed as described below. During these tests, the tubes were heated by combustion fumes. In the pilot plant, indirect quenching to 500° C. was carried out in an in-line TLX type exchanger.

Uncoated tube A had an expansion coefficient of $19.1 \times 10^{-6} °K^{-1}$.

Tube B comprised a $5 \times 10^{-6}$ m thick titanium carbide coating obtained as follows. CVD was carried out in a hot walled reactor. The deposition chamber was graphite. It was heated to 1000° C. using electrical resistances, in a reducing atmosphere. The gaseous mixture was injected into the upper portion of the furnace and each gas was dosed using mass flow meters. The titanium tetrachloride, a liquid under standard temperature and pressure conditions, was preheated to enable it to be dosed as a vapour. The various gases were mixed prior to injection into the deposition furnace. After reaction with the substrates in the deposition chamber, the gaseous products and residues were evacuated by pumping using a pump suited to their corrosive nature. Deposition was effected by introducing a gaseous flux for 10 hours at a pressure of 4 kilopascals. The flux was composed of $TiCl_4$ introduced at a rate of $3.7 \times 10^{-7}$ mole×cm$^{-2}$×s$^{-1}$, methane $CH_4$ introduced at a rate of $2.5 \times 10^{-6}$ mole×cm$^{-2}$×s$^{-1}$ and hydrogen $H_2$ introduced at a rate of $1.5 \times \times 10^{-5}$ mole×cm$^{-2}$×s$^{-1}$. The titanium carbide deposit had an expansion coefficient of $7 \times 10^{-6} °K^{-1}$.

Tube C comprised a $2 \times 10^{-6}$ m thick titanium carbide coating obtained as described above except that the deposition period was 4 hours. Following deposition of the titanium carbide, a $20 \times 10^{-6}$ m thick coating of silicon carbide was deposited using the same furnace, keeping the temperature at 930° C. Deposition was effected by introducing a gaseous flux for 40 hours at a pressure of 4 kilopascals. The flux was composed of trichloromethylsilane $SiCH_3Cl_3$ introduced at a rate of $4 \times 10^{-7}$ mole×cm$^{-2}$×s$^{-1}$ and hydrogen $H_2$ at a rate of $8 \times 10^{-6}$ mole×cm$^{-2}$×s$^{-1}$. The silicon carbide deposit had an expansion coefficient of $4 \times 10^{-6} °K^{-1}$.

Tube D comprised a $20 \times 10^{-6}$ m thick silicon carbide coating obtained as above.

The table below shows the results obtained and also gives the characteristics of the cracked feed.

TABLE

|  | TUBE A | TUBE B | TUBE C | TUBE D |
|---|---|---|---|---|
| DIMENSIONS |  |  |  |  |
| Internal diameter (mm) | 30 | 30 | 30 | 30 |
| Length (m) | 10 | 10 | 10 | 10 |
| OPERATING CONDITIONS |  |  |  |  |
| Naphtha flow rate (kg/h) | 80 | 80 | 80 | 80 |
| Vapour flow rate (kg/h) | 40 | 40 | 40 | 40 |
| TEMPERATURES |  |  |  |  |
| Tube inlet (° C.) | 600 | 600 | 600 | 600 |
| Tube outlet (° C.) | 933 | 933 | 933 | 933 |
| PRESSURES (absolute) |  |  |  |  |
| Outlet (MPa) | 0.155 | 0.155 | 0.155 | 0.155 |
| DWELL TIME (ms) | 130 | 130 | 130 | 130 |

TABLE-continued

|  | TUBE A | TUBE B | TUBE C | TUBE D |
|---|---|---|---|---|
| NAPHTHA CHARACTERISTICS |  |  |  |  |
| Density |  | 0.705 |  |  |
| ASTM Distillation |  |  |  |  |
| Initial Boiling Point (° C.) |  | 36 |  |  |
| Cut point (° C.) |  | 193 |  |  |
| NAPHTHA COMPOSITION (WT %) |  |  |  |  |
| % N paraffins |  | 43.27 |  |  |
| % Isoparaffins |  | 36.81 |  |  |
| % Naphthenes |  | 14.97 |  |  |
| % Aromatics |  | 4.95 |  |  |
| Skin temperature at tube outlet at start of test (° C.) | 1048 | 1048 | 1048 | 1048 |
| Coking rate at tube outlet (gxh$^{-1}$xm$^{-2}$) | 50 | 23 | 4 | 39 |

After disassembling each tube, a visual inspection showed that the coating of Tube D formed from silicon carbide alone was cracked. The coatings of tubes B and C were intact. It can be seen that the coking rate was much lower for tubes including a carbide coating compared with the uncoated tube and that this coking rate was much lower in the case of a tube coated using the method of the invention.

What is claimed is:

1. A passivation method for the metallic surface of a nickel and iron based superalloy with an expansion coefficient of about $10\times10^{-6}$ to about $25\times10^{-6}K^{-1}$ containing less than 0.5% by weight of aluminum used as a constituent material for the walls of a reactor or furnace, which comprises coating at least one of the surfaces of the superalloy which comes into contact with a corrosive atmosphere containing either hydrocarbons at high temperature or containing oxidizing gases at high temperature, with at least two different successive layers superposed directly on one another, said layers comprising:
an external layer which comes into direct contact with the corrosive atmosphere having an expansion coefficient of about $2\times10^{-6}$ to about $10\times10^{-6}K^{-1}$ deposited by chemical vapor deposition of at least one silicon compound and
an intermediate layer positioned between the superalloy surface and said external layer, having an expansion coefficient of about $4\times10^{-6}$ to about $12\times10^{-6}K^{-1}$ deposited by chemical vapor deposition of at least one compound of a metal or metalloid,
the layer(s) being selected such that the value of the expansion coefficients of the layers decreases from that of the superalloy to that of the expansion coefficient of the external layer.

2. A method according to claim 1, in which the intermediate layers obtained by chemical vapour deposition are either stoichiometric or solid solutions.

3. A method according to claim 2, in which the intermediate layers are selected from the group consisting of titanium carbide TiC, titanium nitride TiN, aluminium nitride, nitrides with general formula $Ti_uAl_vN_w$, where u, v and w are positive numbers, and carbo-nitrides of titanium with general formula $Ti_xC_yN_z$, where x, y and z are positive numbers.

4. A method according to claim 1, in which the superalloy contains at least 0.1% by weight of carbon and the intermediate layer in direct contact with the superalloy, comprises at least titanium carbide TiC or at least one solid solution selected from the group consisting of $Ti_xC_yN_z$, wherein x, y, and z are positive numbers, x being between about 0.35 and 0.55, and y and z being between about 0 and about 1.

5. A method according to claim 1, in which the external layer which is in direct contact with the corrosive atmosphere is a coating obtained by chemical vapour deposition of at least one stoichiometric type silicon compound or is formed by at least one solid solution comprising a silicon compound within a Si—Al—O—N—C system.

6. A method according to claim 5, in which the external layer which is in direct contact with the corrosive atmosphere is a or silicon nitride based coating.

7. A method according to claims 1, in which chemical vapour deposition is carried out at a temperature of greater than or equal to about 800° C. and at a pressure of about 100 to about 90000 Pascals.

8. A passivation method according to claim 7, in which the pressure is about 1000 to 10000 Pascals.

9. A passivation method for the metallic surface of a nickel and iron-based superalloy with an expansion coefficient of about $10\times10^{-1}K^{-1}$ to about $25\times10^{-6}K^{-1}$ containing less than 0.5% by weight of aluminum, wherein said superalloy is used as a constituent material for the walls of a reactor or furnace, is in the form of a furnace tube employed for steam cracking of hydrocarbons which comprises:

coating at least one of the surfaces of the superalloy which comes into contact with a corrosive atmosphere containing either hydrocarbons at high temperature or containing oxidizing gases at high temperature, by with at least two different successive layers superposed directly on one another, said layers comprising:
an external layer which comes into direct contact with the corrosive atmosphere having an expansion coefficient of about $2\times10^{-6}$ to about $10\times10^{-6}K^{-1}$ deposited by chemical vapor deposition of at least one silicon compound and
an intermediate layer positioned between the superalloy surface and said external layer, having an expansion coefficient of about $4\times10^{-6}$ to about $12\times10^{-6}K^{-1}$ deposited by chemical vapor deposition of at least one compound of a metal or metalloid,
the layer(s) being selected such that the value of the expansion coefficients of the layers decreases from that of the superalloy to that of the expansion coefficient of the external layer.

10. A method according to claim 9 in which the steam cracking furnace tubes are passivated in-situ before assembly of the pipework in the steam cracking furnace.

11. A method according to claim 9, in which the steam cracking furnace tubes are passivated in-situ after assembly of the pipework in the steam cracking furnace.

12. A method according to claim 1, wherein the intermediate layers are selected from the group formed by titanium carbide (TiC), titanium nitride (TiN), aluminum nitride, nitrides of the formula $Ti_uAl_vN_w$, where u, v and w are positive numbers, and carbo-nitrides of titanium of the formula $Ti_xC_yN_z$, where x, y and z are positive numbers, and the external layer is formed by at least one solid solution comprising a silicon compound within a Si—Al—O—N—C system a silicon carbide or silicon nitride based coating.

13. A. A product obtained in accordance with the method of claim 12.

14. A method according to claim 8, wherein the chemical vapour deposition is conducted at 900–1100° C.

15. A process according to claim 12, wherein the superalloy comprises by weight, 0.2% to 0.6% carbon, 0.5% to 10% of manganese, 0.5% to 2% of silicon, 30% to 40% of nickel, 20% to 30% of chromium, and the balance consisting essentially of iron.

16. A product obtained in accordance with the method of claim 15.

17. A method according to claim 15, wherein each layer of the coating has a thickness in the range of about 0.1 to about 30 microns, with the intermediate layer(s) being thinner than the external layer.

18. A product obtained in accordance with the method of claim 17.

19. In a process for the thermal cracking of a hydrocarbon-containing charge, comprising passing said charge through a pipe still or reaction zone at a temperature of at least about 350° C., the improvement wherein at least part of said reactor or pipe still is a metallic surface of a nickel and iron based superalloy in the form of a furnace tube having an expansion coefficient of about $10 \times 10^{-6}$ to about $25 \times 10^{-6} K^{-1}$ containing less than 0.5% by weight of aluminum, said superalloy having been subjected to a passivation process comprising subjecting the superalloy to at least two different successive layers superposed directly on one another, said layers resulting from the successive chemical vapor deposition of constituent element(s) thereof, the external layer, i.e., that which comes into direct contact with the thermal cracking reaction gases having an expansion coefficient of about $2 \times 10^{-6}$ to about $10 \times 10^{-6} K^{-1}$ resulting from chemical vapor deposition of at least one silicon compound and the layer(s) deposited between the superalloy surface and the external layer having an expansion coefficient of about $4 \times 10^{-6}$ to about $12 \times 10^{-6} K^{-1}$ resulting from chemical vapor deposition of at least one compound of a metal of metalloid from the periodic classification of the elements, the layer(s) being selected such that the value of the expansion coefficients of the layers decreases from that of the superalloy to that of the expansion coefficient of the external layer, wherein the intermediate layers are selected from the group formed by titanium carbide TiC, titanium nitride TiN, aluminum nitride, nitrides with general formula $Ti_uAl_vN_w$, where u, v and w are positive numbers, and carbo-nitrides of titanium with general formula $Ti_xC_yN_z$, where x, y and z are positive numbers, and the external layer is formed by at least one solid solution from the Si—Al—O—N—C system, and is a silicon carbide or silicon nitride based coating.

20. A product comprising a nickel and iron based superalloy containing less than 0.5% by weight of the aluminium and including a passivation coating obtained in accordance with the method of claim 1.

21. A material for the walls of a reactor or furnace comprising a nickel and iron based superalloy with an expansion coefficient of about $10 \times 10^{-6}$ to about $25 \times 10^{-6} K^{-1}$ containing less than 0.5% by weight of aluminum, an intermediate layer positioned on the superalloy surface having an expansion coefficient of about $4 \times 10^{-6}$ to about $12 \times 10^{-6} K^{-1}$ deposited by chemical vapor deposition of at least one compound of a metal or metalloid, and an external layer positioned on the intermediate layer having an expansion coefficient of about $2 \times 10^{-6}$ to about $10 \times 10^{-6} K^{-1}$ deposited by chemical vapor deposition of at least one silicon compound the layer(s) being selected such that the value of the expansion coefficients of the layers decreases from that of the superalloy to that of the expansion coefficient of the external layer.

22. A material according to claim 21, in which the intermediate layers are selected from the group consisting of titanium carbide TiC, titanium nitride TiN, aluminium nitride, nitrides with general formula $Ti_uAl_vN_w$, where u, v and w are positive numbers, and carbo-nitrides of titanium with general formula $Ti_xC_yN_z$, where x, y and z are positive numbers.

23. A material according to claim 21, in which the superalloy contains at least 0.1% by weight of carbon and the intermediate layer comprises at least titanium carbide TiC or at least one solid solution selected from the group consisting of $Ti_xC_yN_z$, wherein x, y, and z are positive numbers, x being between about 0.35 and 0.55, and y and z being between about 0 and about 1.

24. A material according to claim 21, in which the external layer at least one solid solution comprising a silicon compound within a Si—Al—O—N—C system.

25. A material according to claim 21, in which the external layer is a silicon nitride based coating.

* * * * *